United States Patent
Kim et al.

(10) Patent No.: US 7,307,119 B2
(45) Date of Patent: Dec. 11, 2007

(54) THIN FILM MATERIAL USING PENTAERYTHRITOL ACRYLATE FOR ENCAPSULATION OF ORGANIC OR POLYMERIC LIGHT EMITTING DEVICE, AND ENCAPSULATION METHOD FOR LED USING THE SAME

(75) Inventors: Gi Heon Kim, Daejon-Shi (KR); Ji Young Oh, Daejon-Shi (KR); Yong Suk Yang, Busan-Shi (KR); Jeong Ik Lee, Daejon-Shi (KR); Lee Mi Do, Daejon-Shi (KR); Tae Hyoung Zyung, Daejon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 505 days.

(21) Appl. No.: 10/628,253

(22) Filed: Jul. 29, 2003

(65) Prior Publication Data
US 2004/0024105 A1  Feb. 5, 2004

(30) Foreign Application Priority Data
Aug. 1, 2002 (KR) ............ 10-2002-0045479
Jul. 12, 2003 (KR) ............ 10-2003-0047638

(51) Int. Cl.
C08K 3/34 (2006.01)
C08K 3/36 (2006.01)
C08K 3/10 (2006.01)
C08K 5/22 (2006.01)

(52) U.S. Cl. ............ 524/492; 524/433; 524/436; 524/560

(58) Field of Classification Search ............ 524/492, 524/433, 436, 560
See application file for complete search history.

(56) References Cited

U.S. PATENT DOCUMENTS 4,371,566 A * 2/1983 Russell ............ 427/512
4,414,278 A * 11/1983 Cohen et al. ............ 428/402
4,478,876 A * 10/1984 Chung ............ 427/515

(Continued)

FOREIGN PATENT DOCUMENTS

JP    01004605 A  *  1/1989

(Continued)

*Primary Examiner*—David W. Wu
*Assistant Examiner*—Satya B. Sastri
(74) *Attorney, Agent, or Firm*—Lowe Hauptman Ham & Berner LLP

(57) ABSTRACT

The present invention is directed to a thin film material for encapsulation of organic or polymeric light-emitting electric device having light-emitting layer between cathode and anode, for elongation of lifetime of said device and for providing said device with flexibility, more specifically, to a thin film material for encapsulation of organic or polymeric light-emitting electric device comprising polymer having, as repeating unit of backbone, homo-, 2-component co-, ter-, or tetra-polymer of one to four pentaerythritol acrylate monomer, or physically mixed polymer blend of said polymer and polymers other than poly(pentaerythrithol acrylate).

Moreover, the present invention is directed to a method for encapsulation of organic or polymeric light-emitting device using said thin film material consisting of wet and dry process.

The light-emitting device encapsulated according to the present invention can be bended and can be used in the manufacturing of large surface area display.

3 Claims, 1 Drawing Sheet

U.S. PATENT DOCUMENTS

| | | |
|---|---|---|
| 5,734,225 A | 3/1998 | Biebuyck et al. |
| 6,268,695 B1 | 7/2001 | Affinito |
| 6,470,594 B1 * | 10/2002 | Boroson et al. ............... 34/335 |
| 6,673,385 B1 * | 1/2004 | Ding et al. ................. 427/2.28 |
| 6,673,436 B2 * | 1/2004 | Fujimori et al. ............ 428/330 |
| 6,949,284 B2 * | 9/2005 | Yoshihara et al. .......... 428/212 |

FOREIGN PATENT DOCUMENTS

| | | |
|---|---|---|
| KR | 10-0215768 | 5/1999 |
| WO | WO 0188041 A1 * | 11/2001 |
| WO | WO 0255612 A1 * | 7/2002 |

* cited by examiner

THIN FILM MATERIAL USING PENTAERYTHRITOL ACRYLATE FOR ENCAPSULATION OF ORGANIC OR POLYMERIC LIGHT EMITTING DEVICE, AND ENCAPSULATION METHOD FOR LED USING THE SAME

BACKGROUND OF THE INVENTION

1. Field of the Invention

The present invention is directed to a thin film material for encapsulation of organic or polymeric light-emitting device and a method for encapsulation of the organic or polymeric light-emitting device using the same.

2. Description of the Prior Art

Organic light-emitting devices have advantages, a wide viewing angle, a short response time, a high contrast ratio, a high light-emitting efficiency, but also have disadvantages, a short life-time compared to that of conventional LCD (liquid crystal display), and a difficulty in adjustment of color balance due to the differences of life-time between LED devices of red, green and blue. To overcome these disadvantages and to ensure stability and reliability of an organic light-emitting devices, various trials and techniques have been researched and developed. For example, for the ease of processibility, glass or metal lid containing moisture absorbent (e.g, calcium oxide (CaO), or barium oxide (BaO), and so on) are adhered to the substrate by UV-curable epoxy-based adhesives to inhibit the deterioration of the light-emitting devices through blocking of penetration of moisture and oxygen. However, the above encapsulation method implicates problems, such as, difficulties in lightening and thinning (>2 mm) of the device, and moreover, it is impossible to materialize bendable next generation of LED by the above method using the glass or metal lid.

Various methods to overcome the disadvantages implicated in the organic light emitting devices encapsulated by the glass or metal lid such as the method for encapsulation using plastic lid, disclosed in Korean published patent No. 1999-0088334), method for encapsulation by physical or chemical deposition process, disclosed in Korean published patent Nos. 1999-0031394 and 1999-0038057, U.s. Pat. Nos. 5,188,901, 6,268,695, 6,224,948, 6,207,239, 6,228,436, 5,902,641, 6,217,947, 6,203,854, 5,547,508, and 5,395,644, method for encapsulation by spin coating process or molding process encapsulating siloxane polymers on the organic light emitting devices, disclosed in U.S. Pat. Nos. 5,855,994 to Hans Biebuyck et al. of IBM, and 5,734,225, Korean published patent Nos. 1999-0044520, and 2000-0023573, a method of blocking a penetration of moisture and oxygen by covering the device with shield glass, followed by filling silicone oil between the device and shield glass, disclosed in U.S. Pat. No. 5,962,962.

SUMMARY OF THE INVENTION

Therefore, the object of the present invention is to provide novel thin film material for encapsulation to block the penetration of moisture and oxygen, which cause deterioration of the organic or polymeric light emitting device, in order to elongate the lifetime of the device.

The second object of the present invention is to provide a method for encapsulation of organic or polymeric light emitting device using said thin film material, which method is simple and low cost, and can ensure reliability and processibility of organic organic light-emitting devices.

The organic light-emitting device is generally manufactured by a process comprising that, on a glass or plastic transparent substrate, depositing in succession, under vacuum condition, cathode of ITO(Indium Tin Oxide), hole transporting layer, light emitting layer(organics or polymer), electron transporting layer and electron transporting electrode, thereafter, encapsulating by coating polymer on the outside of the light-emitting device. Many kinds of thin film materials for encapsulation have been proposed. U.S. Pat. No. 6,268,695 to John D. Affinito discloses various monomers and polymers for encapsulation through dry process (vacuum deposition process), but pentaerythritol acrylate used in the present invention is not disclosed.

As described above, first object of the present invention can be achieved by polymer having, as repeating unit of backbone, one to four pentaerythritol acrylate monomers represented by formula I or formula II, depicted as below, that is, homo-polymer from one monomer, co-polymer from two monomer, ter-polymer from three monomer, or tetra-polymer from four monomer:

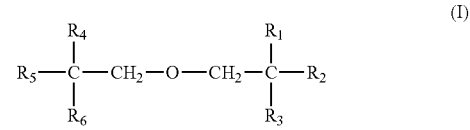
(I)

wherein:

$R_1$, $R_2$, $R_3$, $R_4$, $R_5$ and $R6$ are

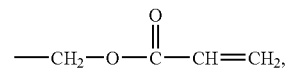

or R1, R2, R3, R4, and R5 are

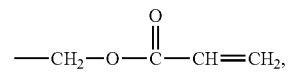

and R6 is $CH_2OH$; or R1, R2, R3, and R4 are

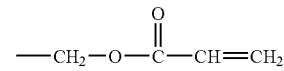

and R5, and R6 are $CH_2OH$; or R1, R2, and R3 are

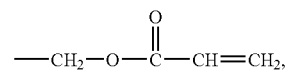

and R4, R5, and R6 are $CH_2OH$; or R1, and R2 are

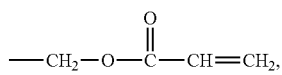

and R3, R4, R5, and R6 are $CH_2OH$;

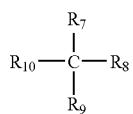

(II)

wherein:
at least one of R7, R8, R9, and R10 is

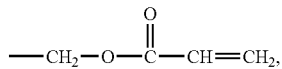

and the remainder of the group are $CH_2OH$.

Poly(pentaerythritol acrylate) for encapsulation of organic or polymeric light-emitting device, polymerized from the monomers dipicted as formula I or II, has superior adhesiveness to the glass or plastic substrate compared to conventional thin film material for encapsulation, and encapsulated organic or polymeric light-emitting device has superior flexibility.

One to four monomer depicted as formula I or II, used for polymerization of poly(pentaerythritol acrylate) for encapsulation of organic or polymeric light-emitting device, according to the present invention may be used in the range from 0.1 to 99.9 wt % based on total weight of reactant.

The first object of the present invention also can be achieved by physically mixed polymer blend of said poly (pentaerythritol acrylate) and other polymers. Polymers other than poly(pentaerythritol acrylate) may be used in the polymer blend in the range from 0.1 to 99.0 wt % based on the total weight of the polymer blend.

The thin film material for encapsulation may be further comprise moisture absorbent, for example, magnesium. calcium, silica gel, zeolite or alkali metal. By the addition of the moisture absorbent, penetration of moisture or oxygen can be blocked effectively, so that, the effect of elongating the lifetime of the organic or polymeric light-emitting device can be enhanced.

The other object of the present invention is to providing a method for encapsulating organic or polymeric light-emitting device using said poly(pentaerythritol acrylate).

The encapsulation method is divided into wet process and dry process. First, the wet process comprises the steps of mixing poly(pentaerythritol acrylate) monomer(s) represented by formula 1 or formula 2, and optical or thermal polymerization initiator in the range of 0.01 to 99 wt % of based on the total weight of a mixture; coating the mixture on the organic or polymeric light-emitting device using said poly(pentaerythritol acrylate) by direct spin coating, bar coating, spreading or immersing the device into the mixture; and initiating polymerization step by irradiating ultraviolet ray to the mixture or heating the mixture.

In the above described process, the wet process may be accomplished by adding polymer(s) other than poly(pentaerythritol acrylate) in the range of 0.01 to 99 wt % based on the total weight of polymer, or by adding moisture absorbents, such as magnesium, calcium, silica gel, zeolite or other alkali metal. By the way, it is also possible to form separate moisture absorbents layer before or after the polymerization step.

Second, the dry process comprises the steps of mixing poly(pentaerythritol acrylate) monomer(s) represented by formula 1 or formula 2, and optical or thermal polymerization initiator in the range of 0.01 to 99 wt % of based on the total weight of a mixture; coating the mixture on the organic or polymeric light-emitting device using said poly(pentaerythritol acrylate) by PVD (physical vapor deposition) or CVD (chemical vapor deposition) method; and initiating polymerization step by irradiating ultraviolet ray to the the mixture or heating the mixture. In the above described process, the wet process may be accomplished by adding polymer(s) other than poly(pentaerythritol acrylate) in the range of 0.01 to 99 wt % based on the total weight of polymer.

Hereinafter, embodiments of the present invention will be explained with reference to the accompanying drawings.

BRIEF DESCRIPTION OF THE ATTACHED DRAWINGS

DESCRIPTION OF THE PREFERRED EMBODIMENT

Figure 1:
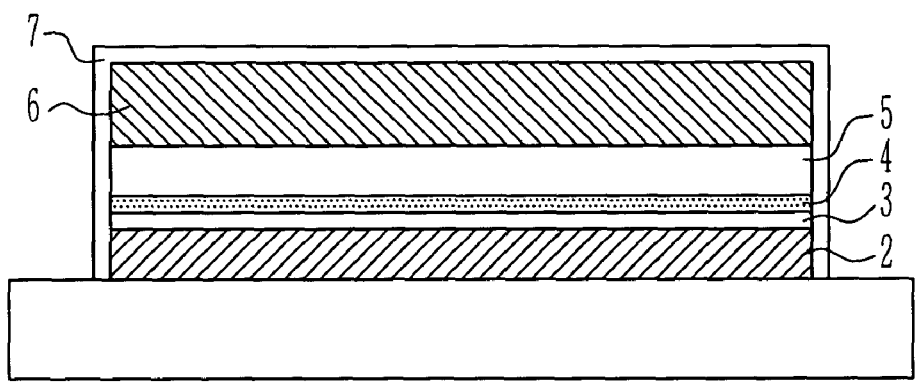
FIG. 1 is a drawing showing a cross-sectional view of light-emitting device encapsulated according to the present invention.

Referring to FIG. 1, transparent glass or plastic materials may be used as substrate(1). First, ITO electrode(2) was coated on the substrate(1), thereafter, hole transporting layer (3) was formed on the ITO electrode(2). Then, light-emitting layer(4) and electron transporting layer(5) were coated on the hole transporting layer(3) by vacuum deposition process. Representative electron transportating material having light emitting property for light-emitting layer(4) and electron transporting layer(5) is Alq3 (tris(8-quinolinolato)aluminum). Subsequently, metal electrode for anode was deposited on the center of the light-emitting layer(4) and electron transporting layer(5). For polymeric light emitting device, the layers (3) and (5) can be omitted.

Hereinafter, embodiments of the present invention will be explained with reference to the following specific examples. The following examples are provided in order to explain the present invention more detail to those skilled in the art, thus, they are not intended in any way to serve as a limitation upon the scope of the present invention. Furthermore, the examples can be easily modified variously by those skilled in the art, however, the modifications are also apparently within the scope of the invention.

EXAMPLES

Example 1

A light emitting device having a layered structure depicted in the FIG. 1 was prepared by following procedures. First, ITO electrode of 0.2 μm thickness was formed on a glass substrate, then, hole injection layer of 20 nm thickness composed of MTDATA (4,4',4''-tris(N-3(3-methylphenyl)-N-phenylamino)triphenylamine) and hole transporting layer of 40 nm thickness composed of NPB (N,N'-biphenyl-N,N'-bis(1-naphentyl)-(1,1'-biphenyl-4,4'-diamine) were formed in turn. Thereafter, green light emitting layer of 60 nm thickness was formed by vacuum deposition of Alq3. On the said light emitting layer, metal electrode for anode composed of 1.2 nm thick LiF and 70 nm thick Al was formed by vacuum deposition. Above described procedures can be established by conventional known process.

Mixed organic solution of 100 parts by weight of liquid pentaerythrithol monomer and 10 parts by weight of polymerization initiator(HSP188) was coated in 8~9 μm thickness on the said layered structure by conventional spin coating process under atmospheric condition. Then, at room temperature and under atmospheric pressure, polymerization reaction was initiated by radiating UV light of 500 mJ/cm2 intensity on the said coating of organic solution, so that a encapsulation thin film was formed. Said liquid pentaerythrithol monomer, commercially available from SKUCB corp., is a multifunctional liquidous monomer containing a mixture of tri- and tetra-acrylates with a high degree of acrylic unsaturation, has viscosity at 25° C. of 1100 mPa?s, acid value of max. 10 mg KOH/g, and transparent appearance. Said initiator, also commercially available from SKUCB corp. under the trademark HSP188, is an optical polymerization initiator belonging to a benzophenone family, and can initiate the optical polymerization when radiating energy greater than 100 mJ/cm2.

As comparative example 1, a light emitting device having same structure with the above-made light emitting device except for not forming encapsulation thin film was prepared following the same procedure as above-mentioned method.

Following the procedure described below, the effect of the encapsulation according to the present invention on the elongation of the light emitting device was evaluated by measuring the luminescence change of the encapsulated light emitting device according to the present invention and non-encapsulated light emitting device of comparative example 1.

Figure 2:
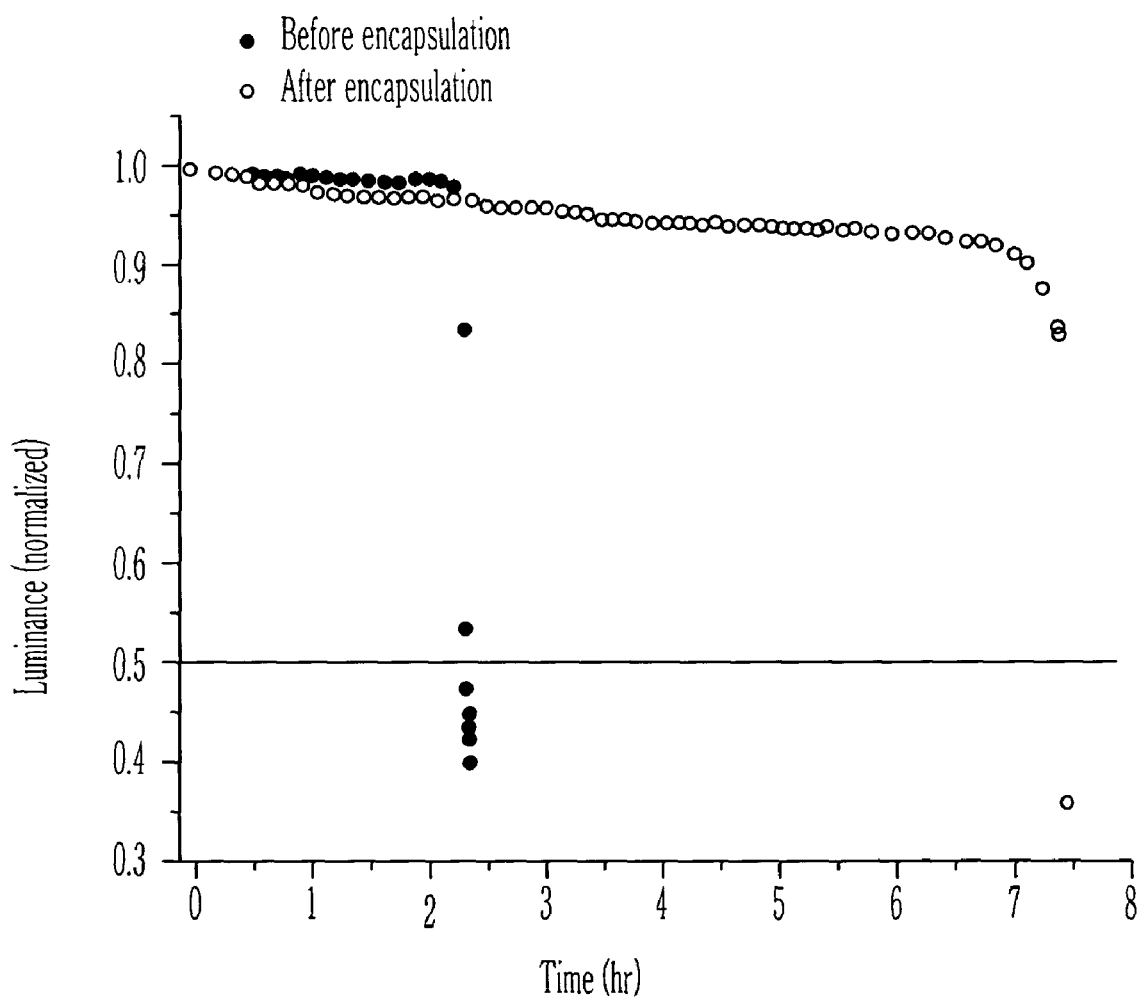
FIG. 2 is a graph showing test results on the effect of lifetime elongation of light-emitting device encapsulated according to the present invention in comparison with the comparative example.

For each of the both light emitting devices, under accelerated condition of 40° C. and 60% RH(relative humidity), the luminescence changes according to the elapse of time were measured while applying constant bias current of 0.1 mA. The test results were summarized in table 1 and showed in FIG. 2. In FIG. 2, luminescence indicated on the vertical axis of the graph were normalized values as value of luminescence measured at respective time/initial value of luminescence.

TABLE 1

| Sample | Initial luminescence(cd/m2) | lifetime (hr) |
| --- | --- | --- |
| Example 1 | 170 | 7.4 |
| Comparative Example 1 | 170 | 2.3 |

In the above Table 1 and following example, lifetime is defined as time taken to decrease the luminescence to half of the initial luminescence.

In the above experiment, although during the encapsulation step by the aforementioned wet process, layered structure of the light emitting device was in contact with the organic solution containing monomer, changes of luminescence, quantum efficiency and other optical characteristics of the light emitting device were not observed. As can be known from the Table 1, the initial luminescence of the light emitting device according to the example 1 of the present invention is equal to that of the comparative example 1, and, no decrease of the initial luminescence was occurred.

Furthermore, it was assured that the lifetime of the light emitting device according to the example 1 of the present invention is elongated much more than that of the comparative example 1. Namely, the lifetime of the light emitting device according to the example 1 of the present invention is much longer than that of the comparative example 1 by more than 3 times.

In the above example 1, the encapsulation step was performed under the atmospheric condition, however, the encapsulation step may be performed under the inert condition, under which condition, oxygen and moisture will be removed. Better result can be expected when the encapsulation step is performed under the inert condition.

Example 2

A light emitting device was prepared following the same procedure as Example 1, except for that PET plastic substrate was used instead of glass substrate, and that NPB layer of 100 nm thickness on the Al electrode to improve the stability of the light emitting device. Same light emitting device as Comparative Example 1 was prepared as Comparative Example 2. The lifetime for light emitting devices of Example 2 and Comparative Example 2 were measured following the same procedure and under the same condition except for the temperature was room temperature.

As a result, the encapsulated light emitting device according to the example 2 of the present invention has lifetime of 367 hours, but the non-encpsulated comparative example 2 has lifetime of 108 hours. Thus, through this example, one can make sure that encapsulation thin film of the invention is valid for the plastic-based light emitting device, as well as glass-based light emitting device.

By using the thin film for encapsulation of organic or polymeric light emitting device according to the present invention, penetration of oxygen and moisture into the light emitting device, so that the lifetime of the light emitting device can be elongated. In addition, the light emitting device encapsulated by the thin film of the present invention has so superior flexibility that the encapsulated device can be applied in the manufacturing of the flexible display.

Furthermore, the encapsulation method of the present invention does not need a separate expensive equipment, in practice, such as vacuum pump, and may form protection film in simple manner, thus, the manufacturing process is simple, so that the productivity can be improved.

What is claimed is:

1. A material for thin film encapsulating an organic or polymeric light emitting device, wherein said material comprises poly(pentaerythritol acrylate) resulting from the polymerization of pentaerythritol acrylate monomer represented by the following formula I or formula II:

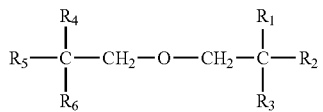
(I)

2. The material for thin film encapsulating an organic or polymeric light emitting device as claimed in claim 1, wherein said poly (pentaerythritol acrylate) is homo-, 2-component co-, ter- or tetra polymer consisting of 1 to 4 pentaerythritol acrylate monomer represented by said formula I or II.

3. The material for thin film encapsulating an organic or polymeric light emitting device as claimed in claim 1, wherein said material is physically mixed polymer blend further comprising at least one other polymer than poly (pentaerythritol acrylate).

* * * * *